United States Patent [19]
Ohmi et al.

[11] Patent Number: 5,784,018
[45] Date of Patent: Jul. 21, 1998

[54] SEMICONDUCTOR CIRCUIT

[75] Inventors: Tadahiro Ohmi, 1-17-301, Komegabukuro 2-chome, Aobu-ku, Sendai-Shi, Miyagi-ken, 980; Takeo Yamashita, Miyagi-ken; Tadashi Shibata, 5-2, Nihondaira, Taihaku-ku, Sendai-shi, Miyagi-ken, 982-02, all of Japan

[73] Assignees: Tadahiro Ohmi; Tadashi Shibata, both of Miyagi-ken, Japan

[21] Appl. No.: 702,689

[22] PCT Filed: Feb. 14, 1995

[86] PCT No.: PCT/JP95/00204

§ 371 Date: Aug. 12, 1996

§ 102(e) Date: Aug. 12, 1996

[87] PCT Pub. No.: WO95/22146

PCT Pub. Date: Aug. 17, 1995

[30] Foreign Application Priority Data

Feb. 14, 1994 [JP] Japan .................. 6-017669

[51] Int. Cl.$^6$ .................. H03M 1/12
[52] U.S. Cl. .................. 341/136
[58] Field of Search .................. 341/136, 118, 341/131, 139, 141

[56] References Cited

FOREIGN PATENT DOCUMENTS 1-144861  6/1989  Japan .

*Primary Examiner*—Brian K. Young
*Attorney, Agent, or Firm*—Randall J. Knuth

[57] ABSTRACT

The invention provides a semiconductor circuit which can fetch and store analog and multilevel data by using a simple circuit. The invention also provides a multilevel memory which can freely change the number of quantizing levels by using external signals. This semiconductor circuit comprises a first circuit which converts first signals into a group of quantized signals, a second circuit which converts the signal group into second multilevel signals, and structure which feeds back the second signals to the first circuit as first signals. The semiconductor circuit further has a structure to electrically separates at least one signal included in the signal group from the input of the second circuit, and structure which feeds back the second signals to the input of the second circuit instead of the signal previously separated.

8 Claims, 9 Drawing Sheets

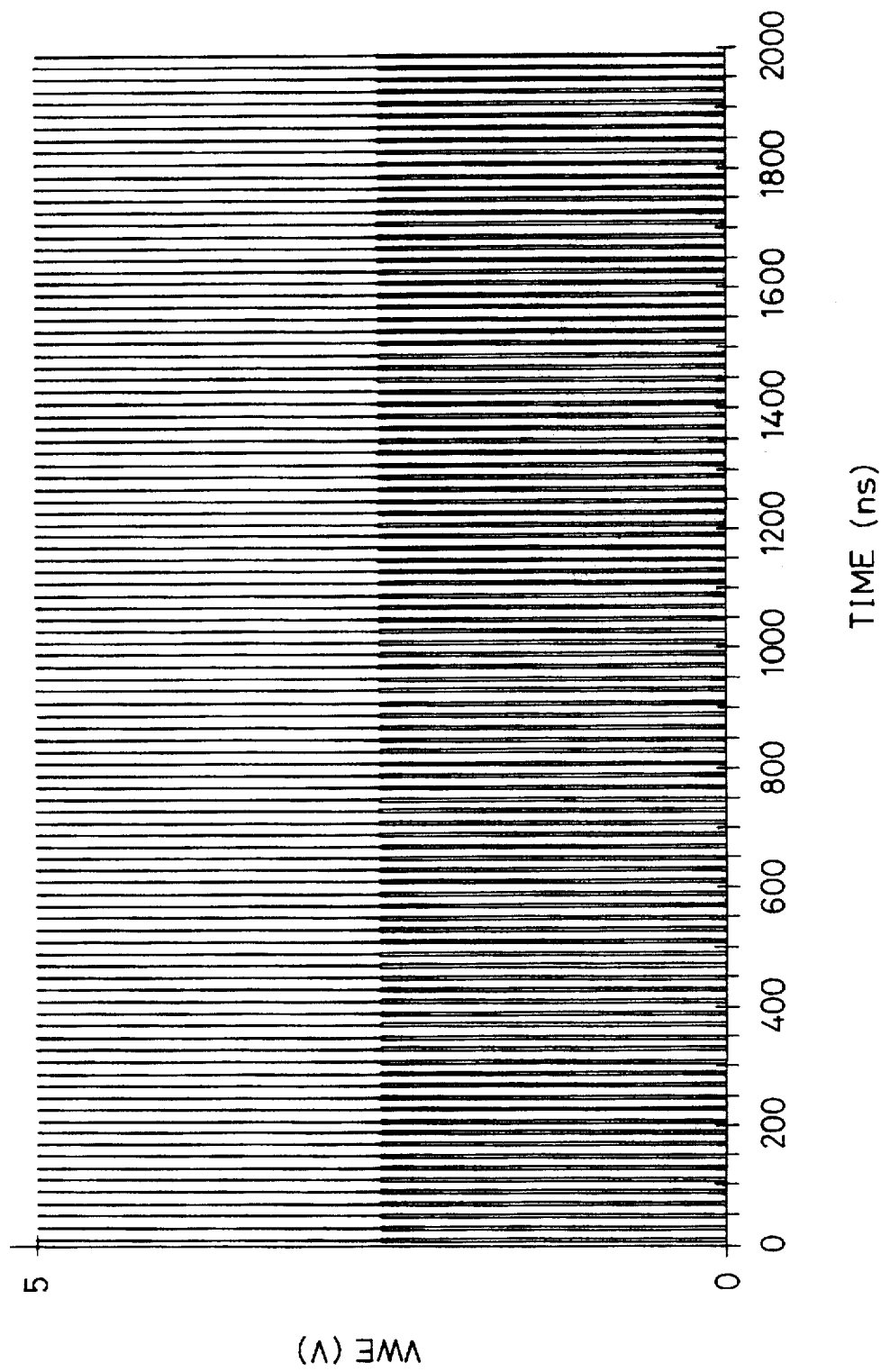

5,784,018

1

SEMICONDUCTOR CIRCUIT

TECHNOLOGICAL FIELD

The present invention relates to a semiconductor circuit, and more particularly provides a highly functional semiconductor integrated circuit which is capable of quantizing analog data, converting these data into multilevel data, and storing these in a static manner, and wherein, furthermore, the number of quantized levels can be set to a freely desired number by means of an external signal.

BACKGROUND ART

In image signal processing such as that of video cameras and the like, conventionally, a large amount of analog data inputted via image sensors was individually converted into a digital format datum by datum, and processing was conducted by means of a digital computer.

When this method was employed, in concert with an expansion in the number of pixels, the number of data to be processed increased, and it became impossible to conduct signal processing in real time.

It was thus necessary to conduct signal processing in a completely parallel manner at the hardware level, dealing with the inputted data in an analog or multilevel format; however, in order to do this, circuitry was necessary for the temporary storage of analog or multilevel data acquired by the sensors, as well as the data in the process of computation.

However, in order to realize such circuitry a very large number of elements were conventionally required, and furthermore, as the addition of the multilevels was conducted by means of electrical current addition, a large amount of power was consumed, and it was difficult to conduct completely parallel signal processing at the hardware level which incorporated all the pixel sensors.

It is an object of the present invention to provide a semiconductor circuit which is capable of accepting and storing analog or multilevel data using simple circuitry. Furthermore, it is an object of the present invention to provide a multilevel memory in which the number of quantized levels can be freely altered by means of an external signal.

DISCLOSURE OF THE INVENTION

The semiconductor circuit of the present invention is a semiconductor circuit comprising a first circuit which converts first signals into a signal group comprising a plurality of quantized signals, a second circuit which converts the signal group into second multilevel signals, and a mechanism for feeding back the second signals to the first circuit as first signals; characterized in that a mechanism for electrically separating at least one signal included in the signal group from the input of the second circuit, and a mechanism for feeding back the second signals as the input of the second circuit instead of at least one signal included in the signal group which was electrically separated from the input of the second circuit, are provided.

Furthermore, the semiconductor circuit is characterized in that the first circuit comprises a A/D converter which converts the inputted signals to a plurality of weighted binary digital signals, and the second circuit comprises a D/A converter which converts the plurality of weighted binary digital signals to multilevel signals.

It is preferable that the first circuit and/or second circuit be constructed using at least one neuron MOS transistor having a semiconductor region of a given conductivity type

2 on a substrate, source and drain regions of an opposite conductivity type which are provided within this region, a floating gate electrode which is provided in a potentially floating state via an insulating film on a region separating the source and drain regions, and a plurality of input gate electrodes which are capacitively coupled with the floating gate electrode via an insulating film.

It is preferable that the second circuit be constructed using an N type neuron MOS transistor and P type neuron MOS transistor having a common floating gate, that the source of the N type MOS transistor and the source of the P type MOS transistor be electrically connected, and that the signal group be electrically coupled with the floating gate by means of capacity coupling.

Function

The circuit comprises a first circuit, which converts first signals which are inputted into a signal group comprising a plurality of quantized signals, and a second circuit, which converts this signal group into second multilevel signals; by means of feeding back the second signals to the input portion of the first circuit, it is possible to convert the first signals which are inputted in an analog or multilevel format into predetermined multilevel signals (second signals) and to latch these.

Additionally, by means of electrically separating at least one signal included in the signal group from the input of the second circuit, and feeding the second signals back as the input of the second circuit in place of this signal, it is possible to alter the quantized levels of the multilevel signals.

Additionally, by means of constructing the first circuit and the second circuit using neuron MOS, it is possible to greatly reduce both the number of elements and the power consumption.

BRIEF DESCRIPTION OF THE DIAGRAMS

FIG. 7 is a graph showing the writing signal of embodiment 3.

(Description of the References)

| | |
|---|---|
| 201, 202, 203 | inverters, |
| 204, 205 | υMOS inverters, |
| 206–208 | output of the A/D converter, |
| 209 | 3-bit υMOS D/A converter, |
| 301–307 | inverters, |
| 308, 309 | υMOS inverters, |
| 310 | 3 bit υMOS D/A converter, |

| | |
|---|---|
| 312 | input signal, |
| 313 | output signal, |
| 401 | P type silicon substrate, |
| 402, 403 | source and drain comprising N⁺ dispersion layers, |
| 404 | gate insulating film (for example, SiO₂ film), |
| 406 | floating gate electrode, |
| 407 | insulating film, |
| 408a, 408b, 408c, 408d | input gates. |

BEST MODE FOR CARRYING OUT THE INVENTION

Hereinbelow, the present invention will be explained in detail using embodiments; however, it is of course the case that the present invention is in no way limited to the embodiments described.

(Embodiment 1)

A first embodiment of the present invention will be explained using the circuit shown in FIG. 1(a). This circuit accepts a signal $V_{IN}$ from the input terminal and outputs this as a quantized multilevel signal; however, in this circuit, the number of quantized levels can be freely altered by means of external signals $\Phi_1$ and $\Phi_2$.

In order to explain the operation of this circuit, the operation during the feedback of the output of the D/A converter to the input of the D/A converter will first be explained.

Figure 1B:
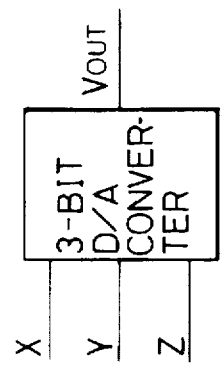
FIG. 1 shows circuit diagrams and characteristic diagrams explaining the basic structure of the present invention.

FIG. 1(b) shows a 3-bit D/A converter. Three binary digital inputs X, Y, and Z are inputted, and the converter outputs a multilevel signal. This output $V_{OUT}$ is expressed by the following formula:

$$V_{OUT}=(4X+2Y+Z)/7 \quad (1)$$

Figure 1D:
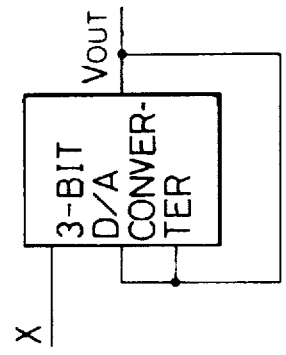
Figure 1A:
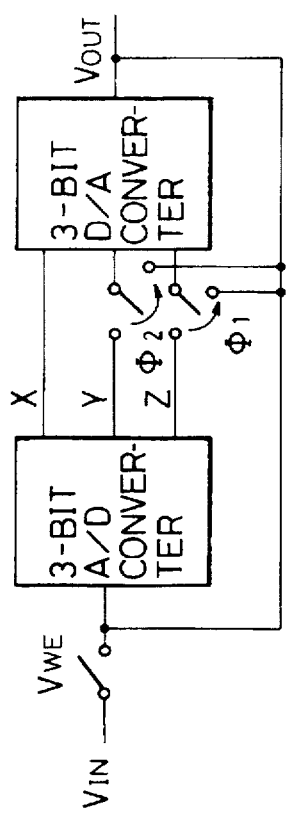
Figure 1C:
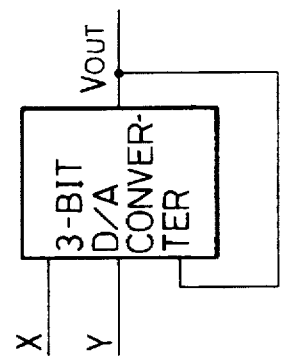

In this circuit, when the output of the D/A converter is fed back to the terminal inputting Z, as shown in FIG. 1(c), then in Formula (1), Z becomes equal to $V_{OUT}$ and the following results:

$$V_{OUT}=(4X+2Y+V_{OUT})/7 \quad (2)$$

From this, it can be seen that the output $V_{OUT}$ will have the following value:

$$V_{OUT}=(4X+2Y)/6 \quad (3)$$

This formula (3) represents the input and output characteristics of a 2-bit D/A converter, so that by means of feeding back the output to the input, it is possible to realize input and output characteristics simulating the situation in which the input terminal to which the output is fed back does not exist.

FIG. 1(d) shows the situation in which feedback is applied to the two terminals into which Y and Z are inputted. In this case, in Formula (1), Y becomes equal to $V_{OUT}$ and Z becomes equal to $V_{OUT}$ and the following results:

$$V_{OUT}=(4X+2V_{OUT}+V_{OUT})/7 \quad (4)$$

and this can be reduced to:

$$V_{OUT}=4X/4=X \quad (5)$$

In such a circuit, if X has a value of 1, the output will be 1, while if X has a value of 0, the output will have a value of 0. The above was an explanation of the operation of the circuit during the feedback of the output of the D/A converter to the input of the D/A converter.

Figure 1F:
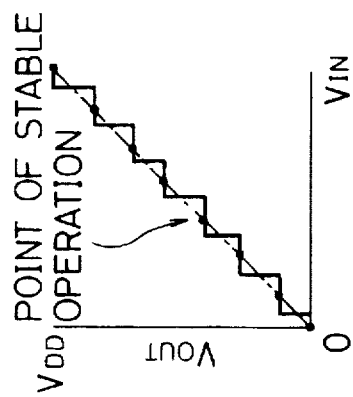
Figure 1E:
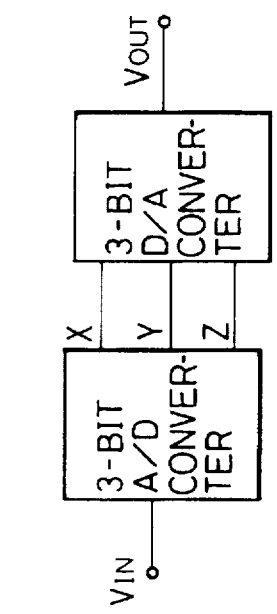

Next, an explanation will be given with respect to, in FIG. 1(a), the feedback of the output of the D/A converter to the input of the A/D converter. FIG. 1(e) shows the case in which no feedback is applied. The input and output of the circuit have stepwise characteristics, as shown in FIG. 1(f). When feedback is formed in a circuit having such input and output characteristics, a stable operation point is produced as shown in the figure, at which the relationship $V_{IN}=V_{OUT}$ is also simultaneously established. In this case, 8 stable operation points are produced. This circuit has the function of maintaining these 8 values in a static manner and can be used as a so-called multilevel static memory.

To return to the explanation of FIG. 1(a), when $\Phi_1$ and $\Phi_2$ are both OFF, that is to say, when the output of the A/D converter is all being inputted into the D/A converter, the operation of the circuit has the function of an 8-level static memory, as shown in FIG. 1(f).

Figure 1I:
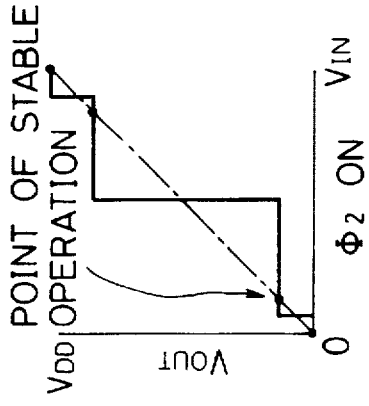
Figure 1H:
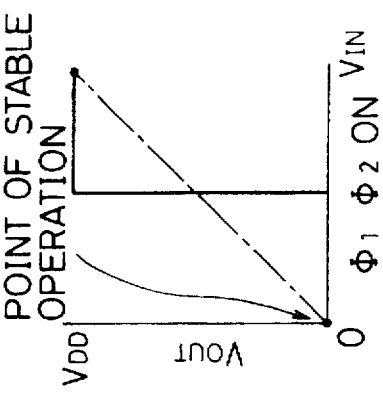
Figure 1G:
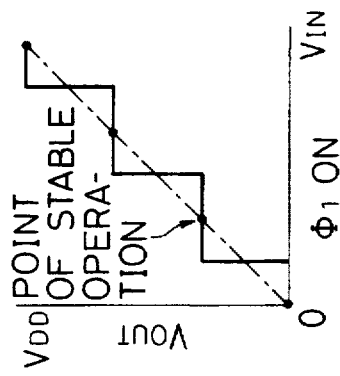

When $\Phi_1$ acquires a value of ON and the input of the least significant bit of the D/A converter is effectively ended, the 3-bit A/D converter functions as a 2-bit A/D converter, and the 3-bit D/A converter functions as a 2-bit D/A converter, so that the stable operational points are as shown in FIG. 1(g). In FIG. 1(g), the stepwise characteristics are equivalent to the input and output characteristics in the case in which feedback is not applied when a multilevel memory is constructed using a 2-bit A/D converter and a 2-bit D/A converter. By applying feedback, four stable operational points are produced at which the $V_{IN}=V_{OUT}$ relationship is also simultaneously fulfilled, as shown in the figure.

When $\Phi_2$ also acquires an ON value and the input of the least and next-to-least significant bits of the D/A converter is effectively ended, the 3-bit A/D converter functions as a 1-bit A/D converter, while the 3-bit D/A converter functions as a 1-bit D/A converter, so that the points of stable operation are as shown in FIG. 1(h). That is to say, such a circuit functions as a 1-bit static memory.

When only $\Phi_2$ has an ON value, and the input of the middle bit of the D/A converter is effectively ended, the 3-bit A/D converter functions as a 2-bit A/D converter, and the 3-bit D/A converter functions as a 2-bit D/A converter; however, these are not a standard 2-bit A/D converter and D/A converter, and the points of stable operation are as shown in FIG. 1(i). That is to say, this circuit serves as an irregular 4-value static memory which is accurate in the region in which the input signal is small and in the region in which the input signal is large.

In this way, it is possible to realize a multilevel memory in which the number of quantized levels can be freely altered by means of input signals $\Phi_1$ and $\Phi_2$ which are externally applied.

Here, the explanation was given with respect to a 3-bit circuit; however, it is of course the case that the number of bits may be freely selected.

(Embodiment 2)

Figure 2:
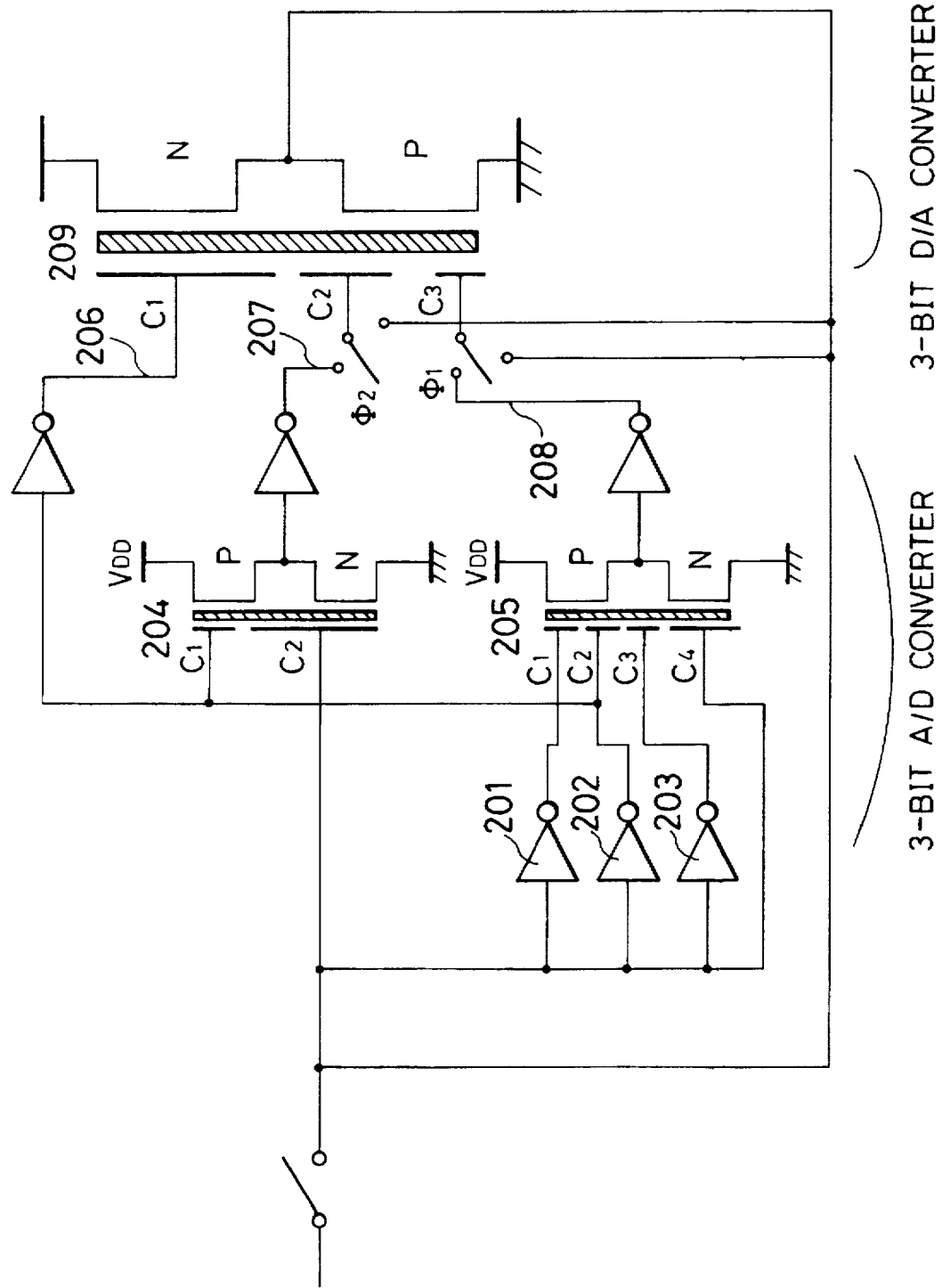
FIG. 2 is a schematic diagram showing a first embodiment of the present invention.

A second embodiment of the present invention will explained using the circuitry of FIG. 2. FIG. 2 represents a construction of the circuitry of FIG. 1(a) using neuron MOS transistors. The circuit comprises a 3-bit VMOS A/D converter and a 3-bit VMOS D/A converter.

Figure 8A:
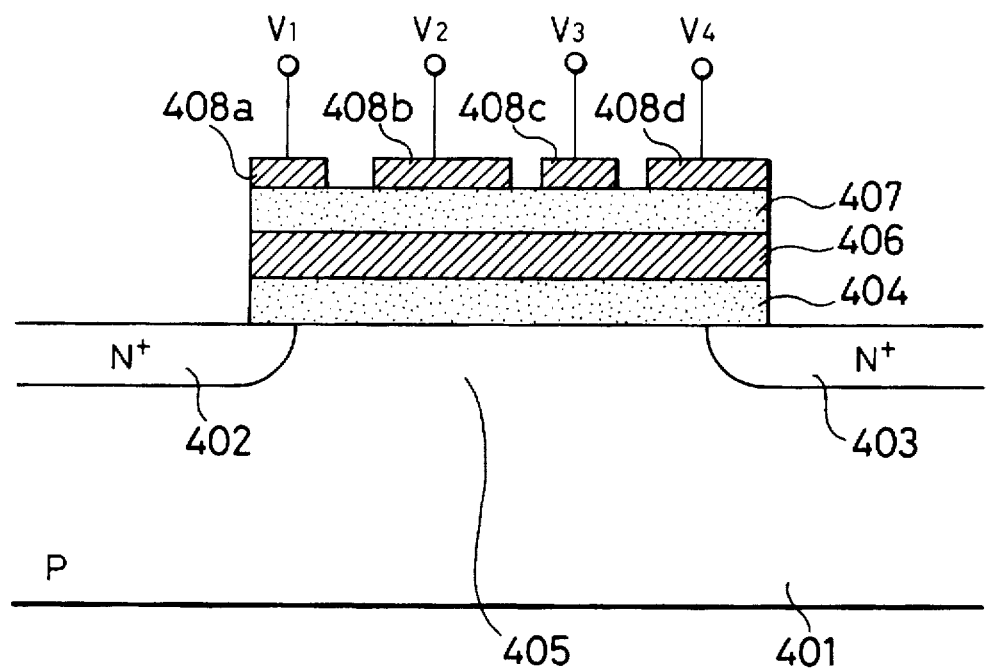
FIG. 8 is a schematic diagram explaining the structure and fundamental principles of the VMOS transistor.

Here, in order to explain the operation of the circuit of FIG. 2, an explanation will first be given with respect to the structure and operational principle of the VMOS. FIG. 8(a) shows an example of the cross-sectional structure of a 4-input N channel VMOS transistor (N-vMOS); reference 401 indicates, for example, a P type silicon substrate, references 402 and 403 indicate a source and drain formed from N⁺ dispersion layers, reference 404 indicates a gate insulating film (for example, a SiO$_2$ film) which is provided on a channel region 405 between the source and the drain, reference 406 indicates a floating gate electrode which is in a potentially floating state and is electrically insulated, reference 407 indicates an insulating film comprising, for example, SiO$_2$ or the like, and references 408a, 408b, 408c, and 408d indicate input gate electrodes.

Figure 8B:
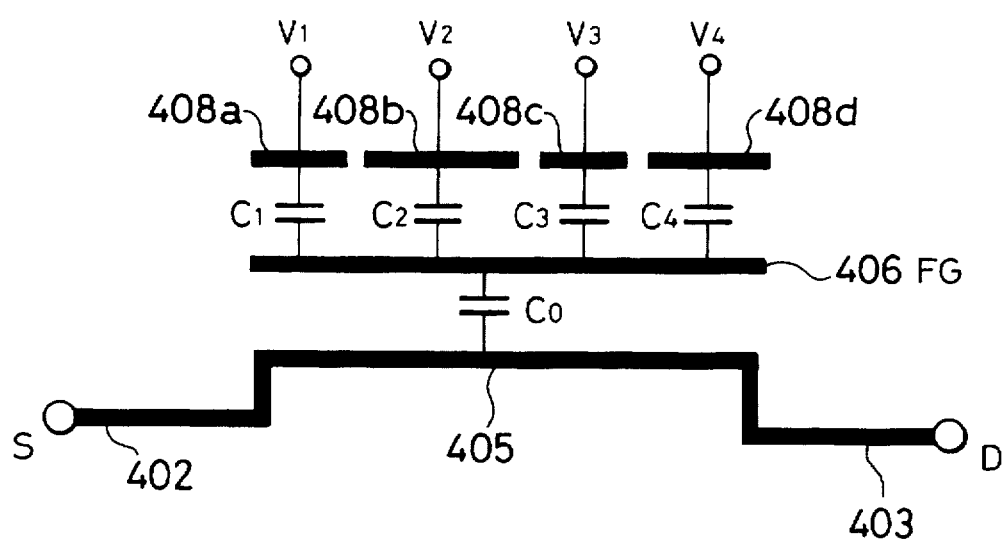

FIG. 8(b) is a diagram which is further simplified for the purpose of analyzing the operation of the VMOS. If the capacitive coupling efficients between each gate electrode are represented by C$_1$, C$_2$, C$_3$, and C$_4$, as shown in the figure, and the capacitive coupling coefficient between the floating gate and the silicon substrate is represented by C$_0$, then the potential $\Phi_F$ of the floating gate is given by the following formula.

$$\Phi_F = (1/C_{TOT})(C_1 V_1 + C_2 V_2 + C_3 V_3 + C_4 V_4)$$

Here, $C_{TOT} = C_0 + C_1 + C_2 + C_3 + C_4$

V$_1$, V$_2$, V$_3$, and V$_4$ indicate voltages which are applied to, respectively, input gates 408a, 408b, 408c, and 408d, and the potential of the silicon substrate is 0V, that is to say, it is grounded.

Now, the potential of source 402 will be set to 0V. That is to say, the potentials of all the electrodes are set to values measured using the source as a standard. When this is done, if the floating gate 406 is seen as a standard gate electrode, then this transistor becomes equivalent to a standard N channel MOS transistor, and when the gate potential of $\Phi_F$ becomes larger than a threshold value (V$_{TH}^*$), then an electron channel (N channel) is formed in the region 405 between the source 402 and the drain 403, and the source and drain become electrically connected. That is to say, the VMOS enters a conductive (ON) state when the following conditions are fulfilled:

$$(1/C_{TOT})(C_1 V_1 + C_2 V_2 + C_3 V_3 + C_4 V_4) > V_{TH}^*$$

The above explanation was given with respect to an N channel VMOS transistor; however, devices also exist in which the source 402, drain 403, and substrate 401 in FIG. 8(a) are all of the opposite conductivity type. In other words, in such a VMOS, the substrate is an N type substrate, and the source and drain are formed from P$^+$ diffusion layers, and this is termed a P type channel MOS transistor (P-VMOS).

The threshold values of the inverters 201, 202, and 203 in the VMOS 3 bit A/D converter are set to, respectively, 3V$_{DD}$/14, V$_{DD}$/2, and 11V$_{DD}$/14, and this can be realized by means of an ion implantation process; however, this can also be realized by employing a VMOS structure and connecting a portion of the input electrodes to either V$_{DD}$ or the ground. The output of the other inverters is set to V$_{DD}$/2.

Furthermore, in VMOS inverter 205, the ratio C$_1$:C$_2$:C$_3$:C$_4$ is set to 2:2:2:7. Furthermore, in VMOS inverter 204, the ratio C$_1$:C$_2$ is set to 4:7.

Figure 3A:
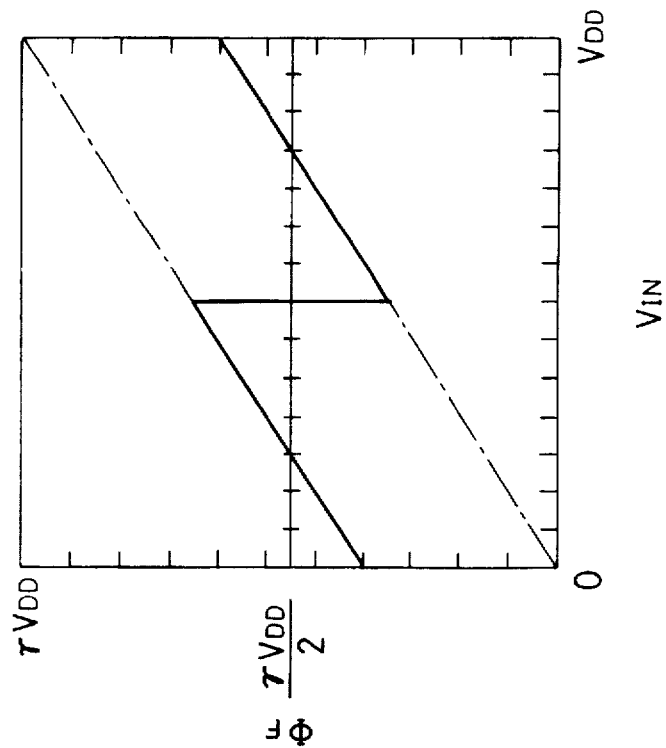
FIG. 3 is a graph showing the relationship between the input voltage of the VMOS inverter of embodiment 1 and the potential of the floating gate.
Figure 3B:
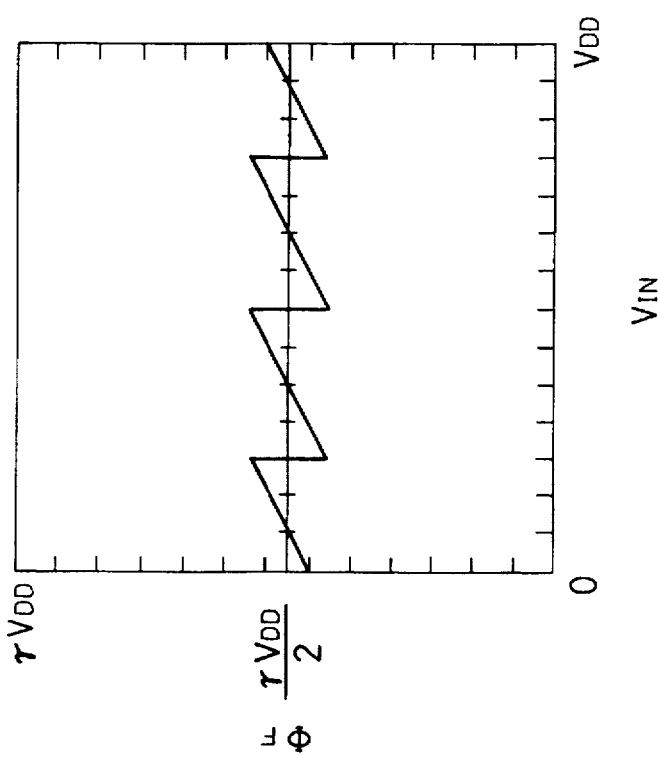

Since the threshold value of inverter 202 is V$_{DD}$/2, the output of the most significant bit 206 of the A/D converter has a value of 0 when the input is within a range of 0–V$_{DD}$/2, and has a value of 1 when the input is within a range of V$_{DD}$/2–V$_{DD}$. The changes in the potential $\Phi_F$ of the floating gate with respect to the input voltage (V$_{IN}$) of the VMOS inverter 205 are shown in FIG. 3(a), while the changes in the voltage of the floating gate with respect to the input voltage of the VMOS inverter 204 are shown in FIG. 3(b). In the figures, $\lambda$ represents a value defined as follows:

$$\lambda = (C_{TOT} - C_0)/C_{TOT}$$

From FIGS. 3(a) and 3(b), it can be seen that when the input voltage is within a range of 0–V$_{DD}$/14, the output of 206, 207, and 208 is (0, 0, 0), when the input voltage is within a range of V$_{DD}$/14–3V$_{DD}$/14, the output is (0, 0, 1), when the input voltage is within a range of 3V$_{DD}$/14–5V$_{DD}$/14, the output is (0, 1, 0), when the input voltage is within a range of 5V$_{DD}$/14–7V$_{DD}$/14, the output is (0, 1, 1), when the input voltage is within a range of 7V$_{DD}$/14–9V$_{DD}$/14, the output is (1, 0, 0), when the input voltage is within a range of 9V$_{DD}$/14–11V$_{DD}$/14, the output is (1, 0, 1), when the input voltage is within a range of 11V$_{DD}$/14–13V$_{DD}$/14, the output is (1, 1, 0), and when the input voltage is within a range of 13V$_{DD}$/14–V$_{DD}$, the output has a value of (1, 1, 1).

The 3-bit VMOS D/A converter 209 has an NMOS and PMOS source follower structure; when the threshold values of the NMOS and PMOS as seen from the floating gate are set to 0, then the voltage of the floating gate appears in an unchanged manner as the output. The capacitive coupling ratio (C$_1$:C$_2$:C$_3$) of the input terminals of the 3-bit VMOS D/A converter 209 is set to 4:2:1, and when the 3 outputs of the A/D converter are all inputted thereinto, the 3 outputs of the A/D converter are automatically subjected to D/A conversion at the floating gate. Accordingly, values representing a D/A conversion of the 3 outputs of the A/D converter appear as the output of the 3-bit VMOS D/A converter 209.

By means of this, the operational points of this circuit are as shown in FIG. 1(f), and when $\Phi_1$ and $\Phi_2$ both have an OFF value, the circuit functions as an 8-level multilevel static memory. Furthermore, the number of quantized levels can also be changed as desired by means of the values of $\Phi_1$ and $\Phi_2$, as was explained in embodiment 1.

Here, the threshold values of the inverters were indicated; however, these may be altered where appropriate.

(Embodiment 3)

Figure 4:
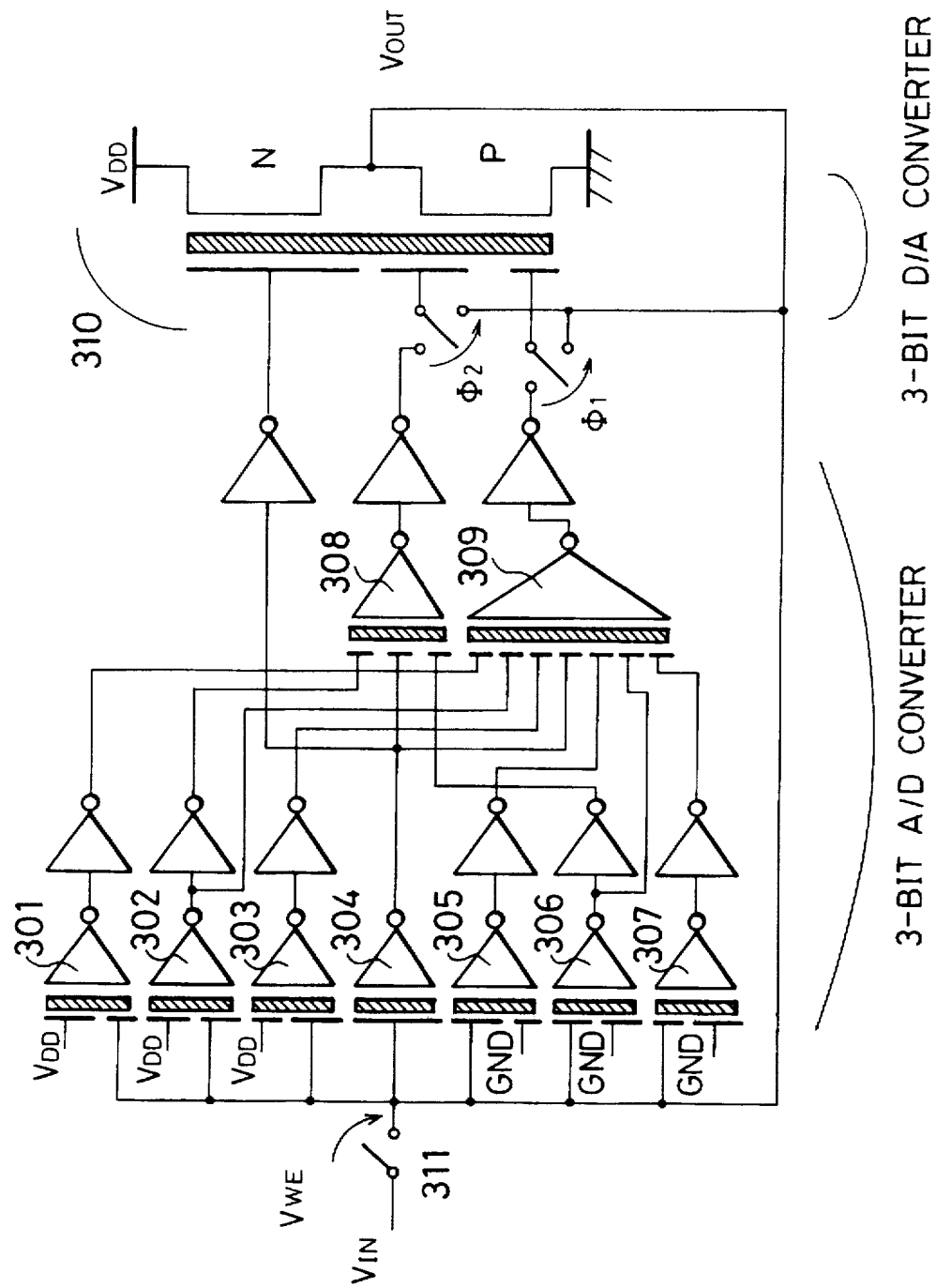
FIG. 4 is a schematic diagram showing a third embodiment of the present invention.

A third embodiment of the present invention will be explained using the circuitry shown in FIG. 4. FIG. 4 shows the structure of FIG. 1(a) constructed using neuron MOS transistors; it comprises a 3-bit VMOS A/D converter and a 3 bit VMOS D/A converter. This circuitry differs from that shown in embodiment 2 in that analog input signals are directly inputted into the VMOS inverters 308 and 309 within the A/D converter. The apparent threshold values of inverters 301–307 as viewed from the input terminals are set to, respectively, V$_{DD}$/14, 3V$_{DD}$/14, 5V$_{DD}$/14, V$_{DD}$/2, 9V$_{DD}$/14, 11V$_{DD}$/14, and 13V$_{DD}$/14. The coupling capacity ratios in the input intervals of VMOS inverters 308 and 309 are all identical.

Figure 5A:
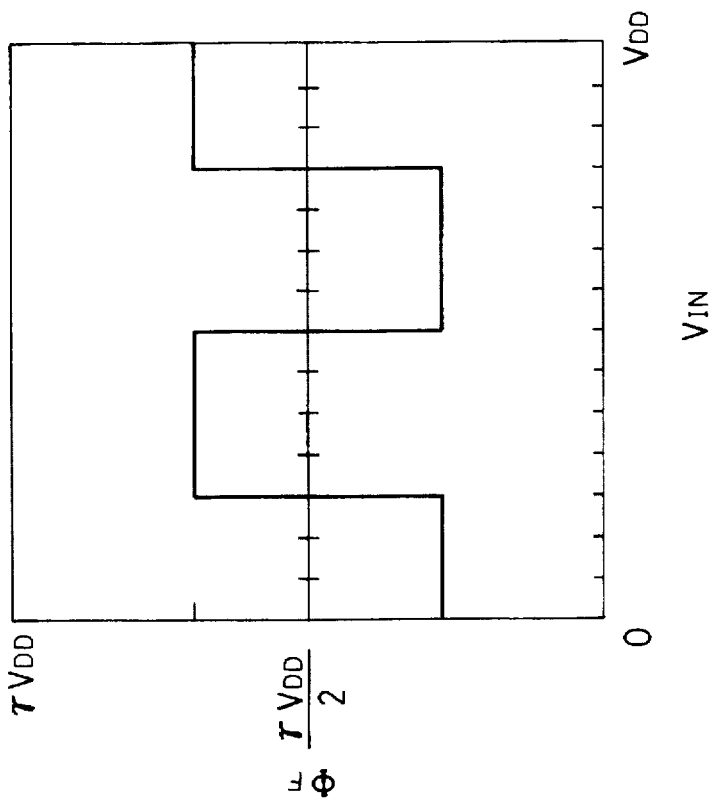
FIG. 5 is a graph showing the relationship between the input voltage of the VMOS inverter in embodiment 3 and the potential of the floating gate.
Figure 5B:
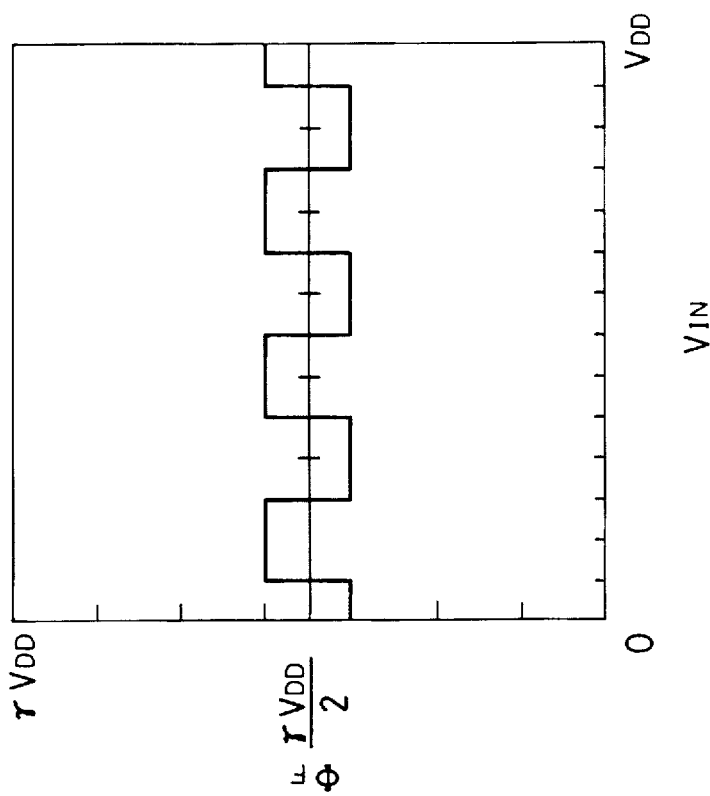

The changes in the floating gate voltages with respect to the input voltage are shown in FIG. 5(a) in the case of VMOS inverter 309, and in FIG. 5(b) in the case of VMOS inverter 308.

V$_{DD}$ and the ground potential are inputted into the 7 input terminals of VMOS 309 at a constant ratio of 3:4 or 4:3, so that the changes in the floating gate voltage with respect to the input voltage alternate between 3$\lambda$V$_{DD}$/7 and 4$\lambda$V$_{DD}$/7. Furthermore, this alternation is conducted entirely by means of the inversion of the pre-stage inverter, so that the floating gate voltage changes rapidly.

V$_{DD}$ and the ground potential are inputted into the 3 input terminals of VMOS inverter 308 at a constant ratio of 1:2 or 2:1, so that the change in the floating gate voltage with respect to the input voltage alternates between $\lambda$V$_{DD}$/3 and 2$\lambda$V$_{DD}$/3. Furthermore, this alternation is also entirely controlled by means of the inversion of the pre-stage inverter, so that the floating gate voltage changes rapidly.

By means of conducting the design in this manner, even when there are fluctuations in the threshold value of the VMOS inverters, the input voltage at which VMOS 308 and 309 invert does not vary, and it is possible to prevent bit loss in the A/D converter output resulting from fluctuations in the threshold value, and A/D conversion which is more accurate than that of the circuit shown in FIG. 2 can be achieved.

Figure 6:
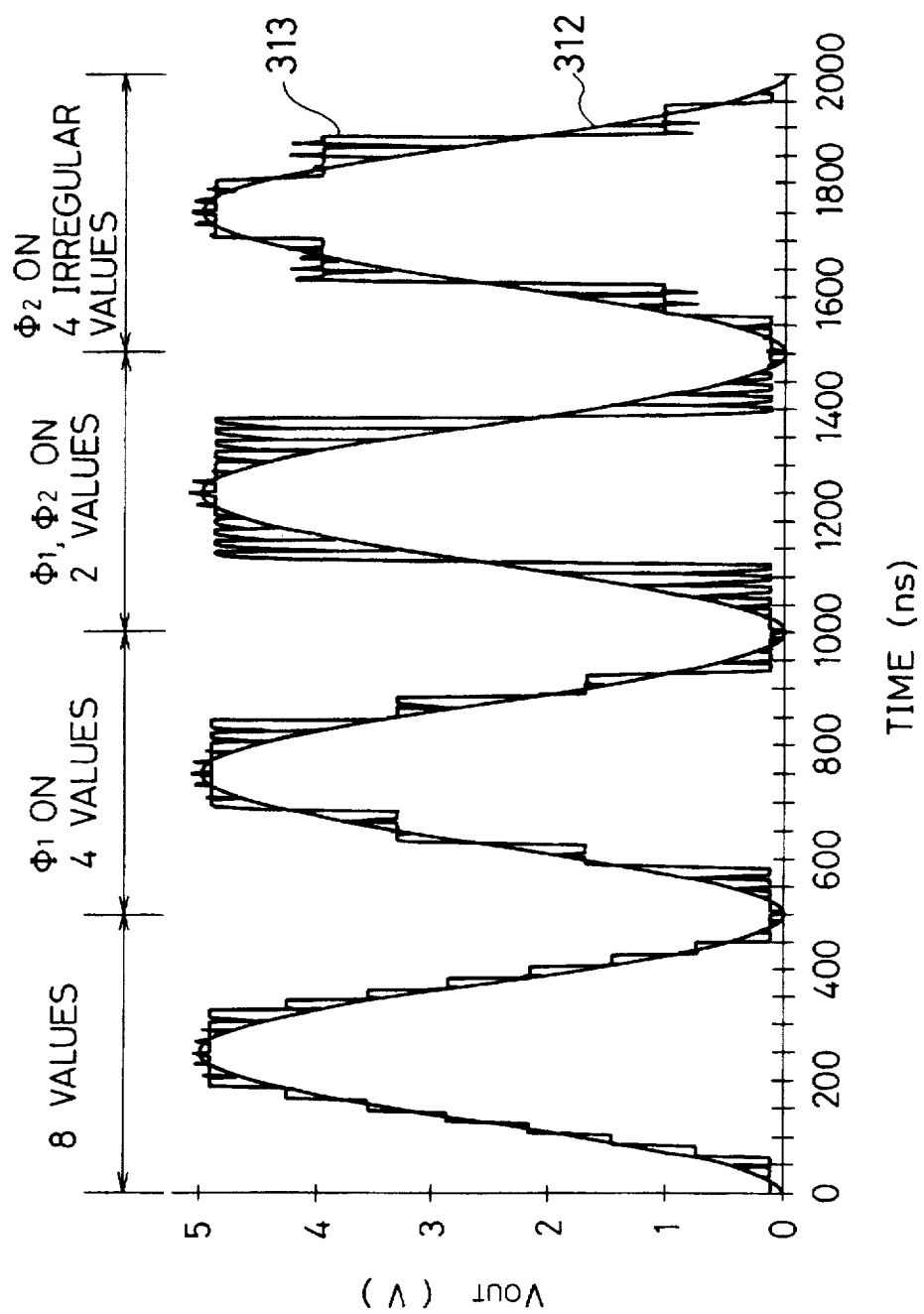
FIG. 6 is a graph showing the results of a circuit simulation in embodiment 3.

FIG. 6 shows the results of circuit simulation with respect to the circuitry of FIG. 4. The input signal is indicated by sine wave 312, and the output signal is indicated by 313. When the writing signal (FIG. 7) which controls writing is in an ON state, the output is in agreement with the input signal; however, when the writing signal is in an OFF state, the output converges at the nearest stable point. It can be seen from these results that by means of the ON and OFF state of $\Phi_1$ and $\Phi_2$, it is possible to alter the accuracy of the quantizing in real time.

In all the neuron MOS transistors in the circuits described above, it is possible to append a switch to the floating gate and thus to appropriately initialize the potential of the floating gate at a freely selected potential. Furthermore, it is of course the case that, in addition to the values of the power source voltage, transistor threshold values, and capacity ratios which were given by way of example, other freely selected values may be employed in accordance with the requirements of the design, and the number of bits of the A/D converter and D/A converter may also be selected in accordance with the use thereof.

Industrial Applicability

By means of the present invention, it is possible to realize in a simple fashion a multilevel memory having a number of quantizing levels which can be freely changed by means of a external signal.

Moreover, realization of such a memory can be accomplished using an extremely small number of elements by means of the use of neuron MOS transistors, so that large scale integration is also a simple matter. Accordingly, this will find use in a broad range of new fields of application requiring high speed and real time processing, from the field of image processing to new circuit actuators employing multilevels, and the like.

We claim:

1. A semiconductor circuit, comprising:
   a first circuit which converts a first signal into a signal group comprising a plurality of quantized signals;
   a second circuit which converts said signal group into a second signal of a plurality of multivalued signals;
   means for feeding back said second signal to said first circuit as said first signal;
   means for electrically separating at least one quantized signal of said signal group from the input of said second circuit; and
   a means for feeding back said second signal to said input of said second circuit instead of said at least one quantized signal of said signal group.

2. A semiconductor circuit in accordance with claim 1, in which said first circuit comprises a A/D converter which converts said first signal into said signal group comprising a plurality of weighted binary digital signals, and said second circuit comprises a D/A converter which converts said plurality of weighted binary digital signals into said second signal of multivalued signals.

3. A semiconductor circuit in accordance claim 1 in which said first circuit and said second circuit are constructed using at least one neuron MOS transistor having a semiconductor region of a conductivity type on a substrate, source and drain regions of an opposite conductivity type provided in this region, a floating gate electrode which is in a potentially floating state and is provided at a region separating said source and drain regions via an insulating film, and a plurality of input gate electrodes which are capacitively coupled with said floating gate electrode via an insulating film.

4. A semiconductor circuit in accordance with claim 3 in which said second circuit is constructed using a N type neuron MOS transistor and a P type neuron MOS transistor having a common floating gate, the source of said N type neuron MOS transistor and the source of P type neuron MOS transistor are electrically connected, and said signal group is electrically coupled with said floating gate by means of capacitive coupling.

5. A semiconductor circuit in accordance with claim 2 in which said first circuit and said second circuit are constructed using at least one neuron MOS transistor having a semiconductor region of a conductivity type on a substrate, source and drain regions of an opposite conductivity type provided in this region, a floating gate electrode which is in a potentially floating state and is provided at a region separating said source and drain regions via an insulating film, and a plurality of input gate electrodes which are capacitively coupled with said floating gate electrode via an insulating film.

6. A semiconductor circuit in accordance with claim 5 in which said second circuit is constructed using a N type neuron MOS transistor and a P type neuron MOS transistor having a common floating gate, the source of said N type neuron MOS transistor and the source of P type neuron MOS transistor are electrically connected, and said signal group is electrically coupled with said floating gate by means of capacitive coupling.

7. A semiconductor circuit in accordance with claim 1 in which one of said first and said second circuit are constructed using at least one neuron MOS transistor having a semiconductor region of a conductivity type on a substrate, source and drain regions of an opposite conductivity type provided in this region, a floating gate electrode which is in a potentially floating state and is provided at a region separating said source and drain regions via an insulating film, coupled with said floating gate electrode via an insulating film.

8. A semiconductor circuit in accordance with claim 7, in which said second circuit is constructed using a N type neuron MOS transistor and a P type neuron MOS transistor having a common floating gate, the source of said N type neuron MOS transistor and the source of P type neuron MOS transistor are electrically connected, and said signal group is electrically coupled with said floating gate by means of capacitive coupling.

* * * * *